United States Patent [19]

Nagata et al.

[11] 4,013,970

[45] Mar. 22, 1977

[54] FREQUENCY DISCRIMINATING APPARATUS

[75] Inventors: Takashi Nagata, Ikeda; Yasuo Nakajima, Osaka; Teruo Kitani, Takatsuki, all of Japan

[73] Assignee: Matsushita Electric Industrial Co., Ltd., Osaka, Japan

[22] Filed: Feb. 19, 1976

[21] Appl. No.: 659,555

[30] Foreign Application Priority Data

Feb. 19, 1975 Japan .................. 50-21205

[52] U.S. Cl. .................. 329/117; 307/233 R; 329/142

[51] Int. Cl.² .................. H03D 3/16

[58] Field of Search .......... 307/233 R, 235 F; 329/110, 117, 142; 334/41

[56] References Cited

UNITED STATES PATENTS

| | | | |
|---|---|---|---|
| 2,712,600 | 7/1955 | Beckwith | 329/117 |
| 2,849,607 | 8/1958 | Leister | 329/117 |
| 3,160,822 | 12/1964 | Dix | 329/117 |
| 3,221,271 | 11/1965 | Waard | 329/117 X |
| 3,614,640 | 10/1971 | Wolf | 307/233 X |
| 3,659,116 | 4/1972 | Sellers et al. | 307/233 |
| 3,934,207 | 1/1976 | Fischman et al. | 329/117 |

Primary Examiner—John S. Heyman

[57] ABSTRACT

A frequency discriminating apparatus is constituted by a piezoelectric ceramic resonator, a reference capacitor, a pre-amplifier including a broad tuning circuit, a pair of amplitude detectors, and a differential amplitude limiter. The piezoelectric ceramic resonator is made of a piezoelectric lead titanate ceramic plate having a pair of electrodes covering the entire area of the major surfaces thereof, and the plate is poled with a poling field of not less than 50 kV/cm in the thickness direction. The thickness of the plate is chosen so as to cause the plate to vibrate in the thickness-extensional vibration of the 3rd harmonic overtone at a preselected frequency when an electrical signal is applied to the pair of electrodes. The differential amplitude limiter differentially adds the two signals detected by the two amplitude detectors and limits the peak output voltage amplitudes to a predetermined amplitude. The center frequency for the frequency discrimination by this apparatus can be stably maintained according to this apparatus, and the apparatus can be easily manufactured in the form of integrated circuits without necessitating many value adjustments of circuit elements.

6 Claims, 4 Drawing Figures

FREQUENCY DISCRIMINATING APPARATUS

This invention relates to a frequency discriminating apparatus for an automatic frequency control circuit of a color television tuner.

A known frequency discriminator for an automatic frequency control circuit of a color television tuner is usually composed of a ratio detector which is constituted by a combination of several electrical transformers and electrical capacitors. The electrical transformers have inductance elements, and in assembling these elements into an apparatus, value adjustments of these inductance elements are necessary for the purpose of the adjustment of operating frequency (center frequency) for the frequency discrimination. For achieving this adjustment, it is necessary to manually move movable portions of the inductance elements, which is quite troublesome. Further, the manually movable portions of inductance elements are likely to move during long use or in transportation of color televisions in which the frequency discriminating apparatus, after being adjusted, are provided. Furthermore, because of the use of the inductance elements, the known frequency discriminator can not be effectively manufactured in the form of integrated circuits.

It is an object of this invention to provide a frequency discriminating apparatus for discriminating a frequency in comparison with a predetermined frequency as a center frequency of frequency discrimination, for an automatic frequency control circuit of a color television tuner, which apparatus does not need many value adjustments during the assembly thereof and can be easily manufactured in the form of integrated circuits.

This object is achieved according to this invention by providing a frequency discriminating apparatus for discriminating a frequency in comparison with a predetermined frequency as a center frequency of frequency discrimination, the apparatus comprising: a pre-amplifier receiving an input signal to said apparatus and including a tuning circuit for tuning said input signal; a reference capacitor receiving at the input terminal thereof an output signal from said pre-amplifier; a piezoelectric resonator using a piezoelectric lead titanate ceramic plate having an input electrode and an output electrode applied to the entire opposed major surfaces thereof, respectively, said input electrode receiving said output signal from said pre-amplifier, said ceramic plate being poled with a poling field of not less than 50 kV/cm in the thickness direction of said ceramic plate and having a thickness so as to cause the plate to vibrate in the thickness-extensional vibration of 3rd harmonic overtone of said ceramic plate upon being excited by said output signal from said pre-amplifier for setting the center frequency of frequency discrimination between the resonant frequency and the anti-resonant frequency of said 3rd harmonic overtone of said ceramic plate; a first amplitude detector coupled to said output electrode of said piezoelectric resonator for detecting the amplitude of an output signal from said output electrode of said piezoelectric resonator; a second amplitude detector coupled to the output terminal of said reference capacitor for detecting the amplitude of an output signal from the output terminal of said reference capacitor; and a differential amplitude limiter coupled to said first amplitude detector and said second amplitude detector for differentially adding output signals from said first and said second amplitude detectors and for limiting the added output signals from said first and said second amplitude detectors to predetermined amplitudes in two frequency ranges, one of which includes said resonant frequency and the other of which includes said anti-resonant frequency of said 3rd harmonic overtone of said ceramic plate.

This apparatus works stably, and the predetermined frequency which is the center frequency for the frequency discrimination by this apparatus can be stably maintained even upon fluctuation of the ambient temperature and/or the input signal frequency and even if the ceramic plate produces spurious responses near the resonant and anti-resonant frequencies between which the center frequency of frequency discrimination is set.

This and other objects and features of this invention will be apparent upon consideration of the following description taken together with the accompanying drawings, in which.

Figure 2:
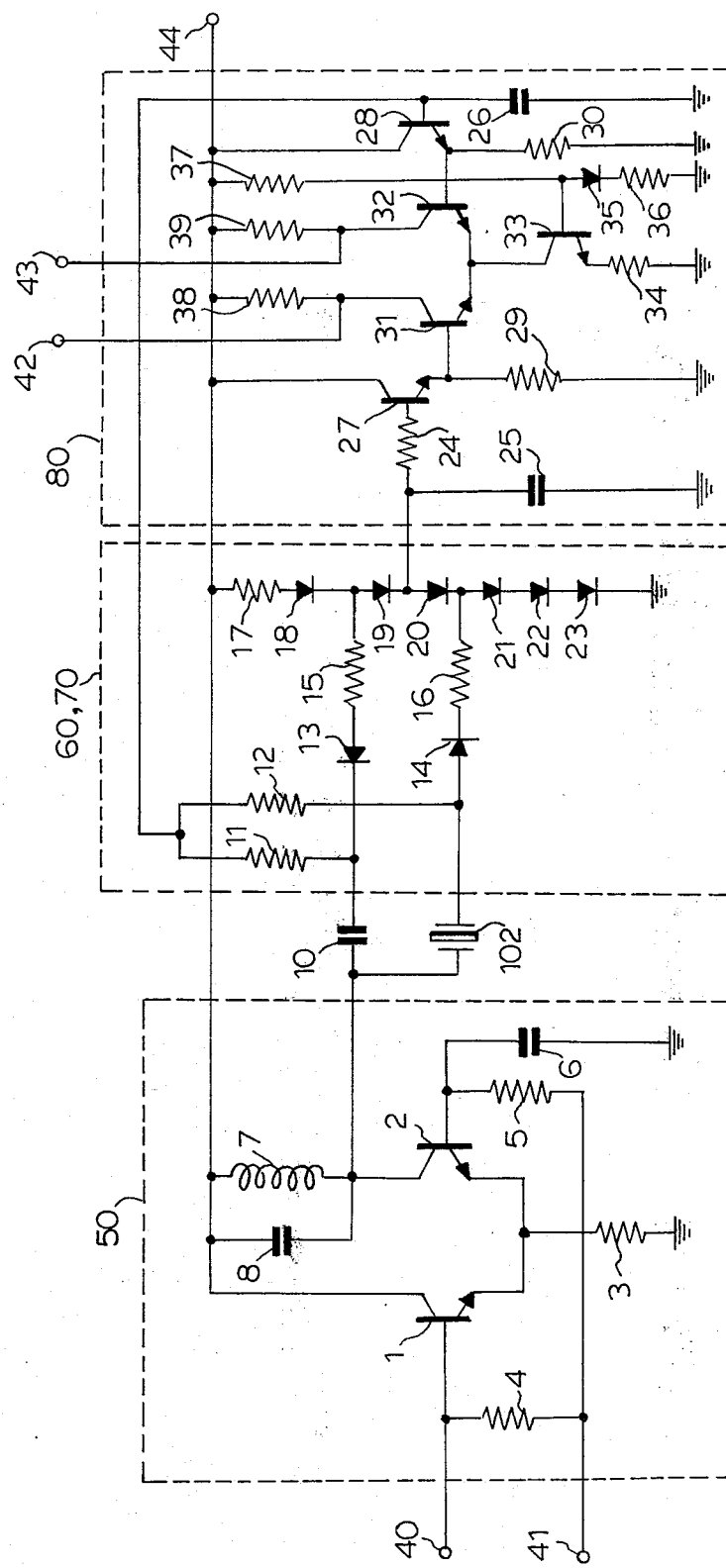
FIG. 2 is a circuit diagram of an example of a frequency discriminating apparatus of this invention.
Figure 3:
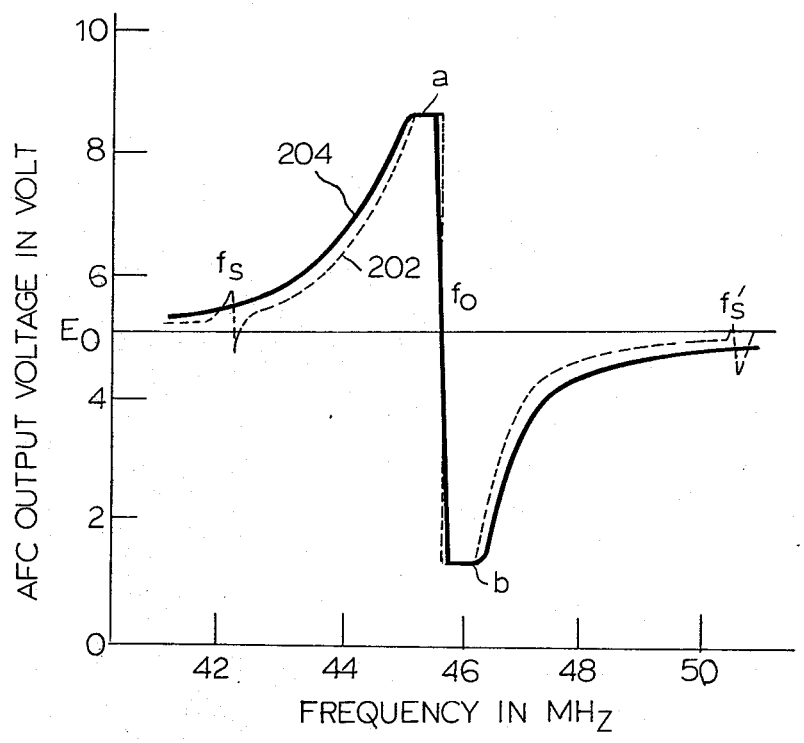
Figure 4:
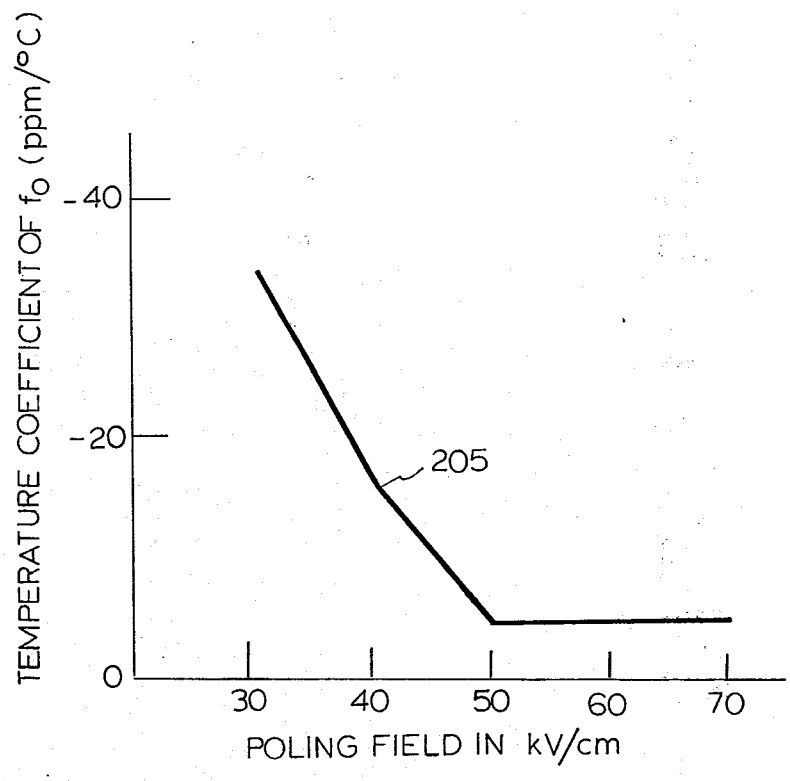

FIG. 3 is a graph showing frequency discriminating output curves obtained by the frequency discriminating apparatus of FIG. 2, when two types of piezoelectric ceramic resonators are used; and FIG. 4 is a graph showing the relation between temperature coefficients of a center frequency for frequency discrimination and poling fields for poling the piezoelectric ceramic plate used for the resonator in the frequency discriminating apparatus of FIG. 2.

Figure 1:
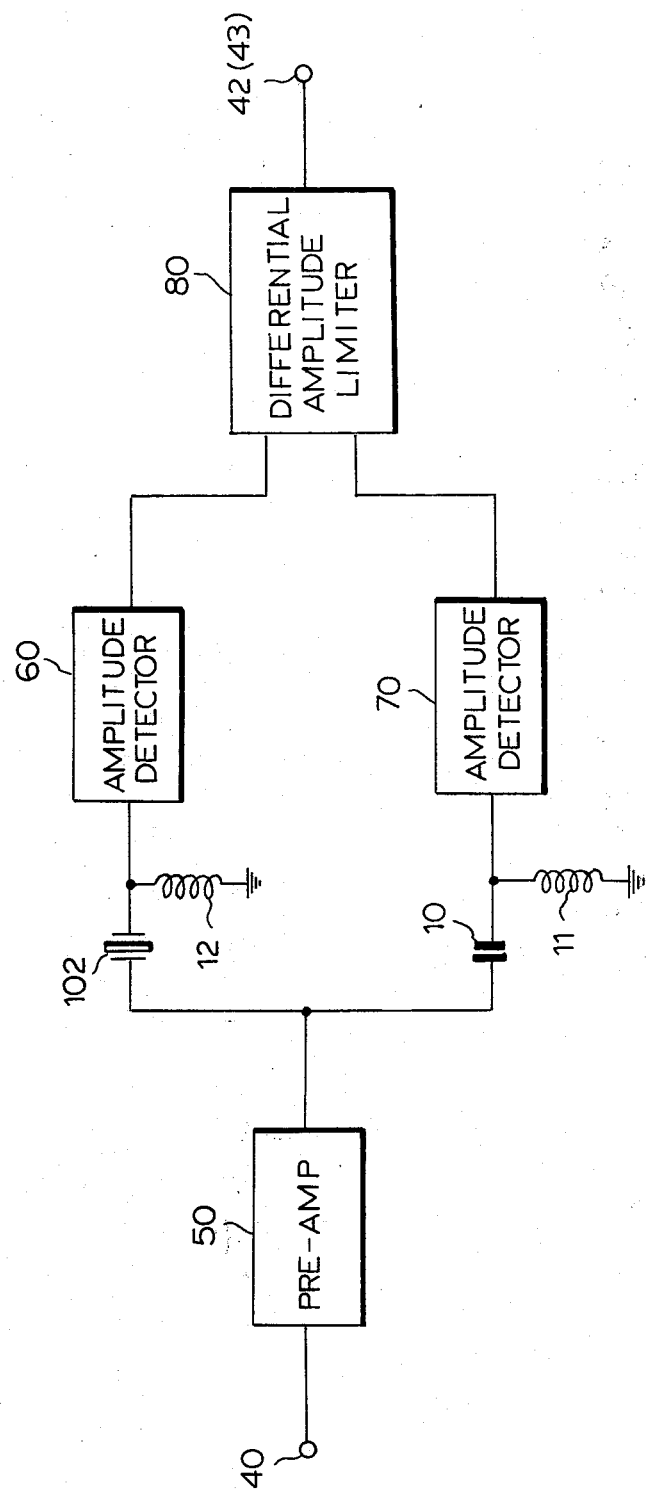
FIG. 1 is a circuit diagram, mostly in block form, of an example of a frequency discriminating apparatus of this invention.

Referring to FIG. 1, an example of a frequency discriminating apparatus according to this invention is shown, which comprises: a pre-amplifier 50 through which an electrical input signal is applied, after being amplified, to a piezoelectric ceramic resonator 102 and to a reference capacitor 10, respectively; a pair of amplitude detectors 60 and 70 by which the electrical signal from the piezoelectric ceramic resonator 102 appearing at an impedance 12 and the electrical signal from the reference capacitor 10 appearing at an impedance 11 are detected, respectively; and a differential amplitude limiter 80 in which the detected signals from the pair of amplitude detectors 60 and 70 are added differentially and the added signals having levels exceeding a pre-determined level are limited.

Further details will be described with reference to FIG. 2 in which like reference numerals designate like parts of the apparatus as in FIG. 1. FIG. 2 shows a practical example of a frequency discriminating apparatus as shown schematically in FIG. 1. In FIG. 2, an electrical signal applied to an electrical terminal 40 is amplified in a pre-amplifier stage comprising a network of transistors 1 and 2 and resistors 3, 4 and 5 as shown. A D.C. bias voltage is fed to an electrical terminal 41, and the base of the transistor 2 is grounded for an A.C. signal by a capacitor 6. The pre-amplified signals appearing at the piezoelectric ceramic resonator 102 and the reference capacitor 10 are detected by a first rectifier (diode) 14 and a second rectifier (diode) 13, respectively. The first rectifier 14 and the second rectifier 13 are main elements of the first and the second amplitude detectors 60 and 70, respectively. A resistor 17 and diodes 18, 19, 20, 21, 22 and 23 operate to feed a suitable D.C. bias voltage to a differential amplitude limiter 80, and a capacitor 25 eliminates an A.C. signal component. Since the rectifiers 13 and 14 are connected reversely to each other, i.e. the rectifying direction of the first rectifier 14 is opposite to the rectifying direction of the second rectifier 13, respective detected signals are differentially added at the capacitor 25 which is a component of the differential amplitude limiter 80. The detected signals at the capacitor 25 are amplified in the differential amplitude limiter 80, which includes transistors 31, 32 and 33, resistors 38, 39 and 34 and an emitter follower circuit composed of a transistor 27 and a resistor 29. The D.C. balance of the differential amplitude limiter 80 is suitably adjusted by resistors 15, 16, 11, 12 and 24 and the emitter follower circuit composed of a transistor 28 and a resistor 30. A capacitor 26 is used as a bypass capacitor for an A.C. signal. An electrical terminal 44 is provided to be connected to a D.C. bias source (not shown). The frequency discriminating output signal can be obtained at an electrical terminal 42 and/or an electrical terminal 43. Since the polarities of the output signals at the terminals 42 and 43 are opposite to each other, a desired polarity of output signal can be obtained by selecting the terminals 42 and 43.

All the electrical circuit elements described with reference to FIG. 2, can be easily assembled in one chip integrated circuit except the piezoelectric ceramic resonator 9, the capacitors 6, 8, 10, 25 and 26 and the inductor 7. Thus, the pre-amplifier, the first and second amplitude detectors and the differential amplitude limiter can substantially be assembled easily in the form of an integrated circuit. Accordingly, the number of separate electrical components to be used can be greatly decreased.

The tuning circuit composed of the inductor 7 and the capacitor 8 is preferably a broad tuning circuit so as to balance an odd symmetry of an output curve of frequency discrimination, i.e. to obtain symmetry in the frequency discrimination output curve with respect to the center frequency of frequency discrimination.

In a frequency discriminating apparatus for a color television tuner, a specified center frequency for the frequency of one country is often different from that of another country, e.g. 45.75 MHz in the United States of America and 58.75 MHz in Japan. But the frequency range of the center frequency is always between about 40 MHz and about 60 MHz. A frequency discriminating output response curve (characteristics) of an apparatus of this invention is influenced by the piezoelectric ceramic resonator 102. Thus, piezoelectric ceramic resonators which are operable in the frequency range between 40 and 60 MHz are desired as the resonator 102 of FIG. 2.

Referring to FIG. 3, a dotted curve 202 and a solid curve 204 represent frequency discriminating output curves of an automatic frequency control circuit as shown in FIG. 2, when a so-called trapped energy type resonator and a so-called dissipated type (spurious random-scattering type) resonator are used, respectively. A trapped energy type resonator is comprised of a piezoelectric lead titanate ceramic plate having a pair of electrodes each on a suitably limited area of each of the major surfaces of the plate. The length of each electrode is usually about 3 to 6 times as long as the thickness of the plate, and the edge of the electrode is usually remote from the edge of the major surface of the plate by a distance longer than twice the length of the electrode. In obtaining measurements for obtaining the dotted line curve 202 of FIG. 3, the thickness of the ceramic plate was selected so as to induce thickness-extensional vibration of the 3rd harmonic overtone at a pre-selected frequency, when an electrical signal was applied to the pair of electrodes. It was found that the trapped energy type resonator has spurious resonant responses marked with $f_s$ and $f_s'$ in the curve 202. Further, the spurious resonant responses cause a so-called pseudo-pull-in effect to an input signal at the frequencies of these spurious resonances. As the result, a color signal of a color television receiver is lost, due to the pseudo-pull-in frequencies. Therefore, the trapped energy type resonator is not suitable for the frequency discriminating apparatus.

A dissipated type resonator is comprised of a piezoelectric lead titanate ceramic plate having a pair of electrodes on substantially the entire major surfaces of the plate. The ceramic plate is preferably in the form of a square plate. The side surface of the plate is preferably rough (rough edge), and the roughness is usually more than a fourth of the wavelength of the desired thickness-extensional vibration. U.S. Pat. No. 3,717,778 shows one kind of a dissipated type ceramic resonator. In the measurements for obtaining the solid line curve 204 of FIG. 3, the thickness of the plate was selected to induce the thickness-extensional vibration of the 3rd harmonic overtone at a pre-selected frequency, when an electrical signal was applied to the pair of electrodes. It was found from the curve 204 of FIG. 3 that the spurious resonant responses marked with $f_s$, $f_s'$ observed in the case of the trapped energy type resonator does not appear in the case of the dissipated type resonator. Strictly speaking, the dissipated type resonator sometimes has small spurious resonant responses near the resonant frequency and the anti-resonant frequency of the thickness-extensional vibration of the 3rd harmonic overtone. It has been found that these small spurious resonant responses can be suppressed by the amplitude limiting effect of the differential amplitude limiter provided in the frequency discriminating apparatus of this invention. Thus, the required amount of amplitude limitation by the differential amplitude limiter is such an amount as to suppress the spurious responses in the two frequency ranges, one of which includes said resonant frequency and the other of which includes said anti-resonant frequency, i.e. near each of the resonant and anti-resonant frequencies of the ceramic resonator. Usually, the spurious responses exist in a small frequency range near each of the resonant and anti-resonant frequencies, and it has been found that the required minimum amount of amplitude limitation, numerically expressed, is about 5 dB in the impedance-frequency curve of the ceramic resonator. That is, it is preferred according to this invention that in an impedance-frequency curve of the ceramic resonator (3rd harmonic overtone), the impedance value at the resonant frequency which is the lowest impedance of the impedance-frequency curve of the 3rd harmonic overtone of the ceramic resonator be cut by the differential amplitude limiter so as to cause an impedance higher by at least 5 dB than the impedance at the resonant frequency to be the minimum impedance of the impedance-frequency curve, and the impedance value at the anti-resonant frequency which is the highest impedance of the impedance-frequency curve be cut by the differential amplitude limiter so as to cause the impedance lower by at least 5 dB than the impedance at the anti-resonant frequency to be the maximum impedance of the impedance-frequency curve of the 3rd harmonic overtone of the ceramic resonator. On the other hand, the upper limit of the amount of the amplitude limitation by the differential amplitude limiter is, as will be obvious to those skilled in the art, determined by the minimum pull-in frequency range that the color television tuner is required to have. From this point of view, it is preferred that in practice in the impedance-frequency curve of the ceramic resonator, the difference between the resultant minimum and maximum impedances of the impedance-frequency curve be at least about 10 dB. This amplitude limiting effect is represented by the flat portions of the curve 204 marked with $a$ and $b$.

Referring to FIG. 3 again, the frequency $f_o$ at a crossing point between the curve 202 (204) and the base line of a standard D.C. voltage $E_o$ is the center frequency of frequency discrimination according to the frequency discriminating apparatus. The stability of the center frequency $f_o$ under a fluctuation the ambient temperature is especially important for a frequency discriminating apparatus for automatic frequency control in a color television tuner, since the chromatic response of a color picture on a screen of a color television receiver is controlled by the center frequency $f_o$. As a reasonable criterion of the stability of the center frequency $f_o$, it is usually considered that the temperature coefficient of the center frequency $f_o$ should be less than $|20|$ ppm/° C.

Referring to FIG. 4, the curve 205 represents a temperature characteristic response curve, i.e. the relation between the temperature coefficient of the center frequency $f_o$ and the poling field used for poling a piezoelectric lead titanate ceramic plate in a resonator 102. It is seen from FIG. 4 that the temperature coefficient of $f_o$ can be greatly reduced to a very small value (−5 ppm/° C in FIG. 4), when the piezoelectric lead titanate ceramic plate is poled in a poling field not less than 50 kV/cm. In the experiments made for obtaining the curve 205, the poling temperature and the poling time were 200° C and 10 minutes, respectively. From other experiments using various poling temperatures and poling times also, a poling field of not less than 50 kV/cm was found to give a significant effect of suppression of temperature coefficient of $f_o$. This is one of the reasons why fine frequency adjustment in a circuit assembly is not required in an apparatus of this invention, and integrated circuit technique can be effectively used for the apparatus of this invention. There is essentially no upper limit of the poling field. However, depending on the kinds of ceramic plates, some plates get broken by being subjected to poling of too high an electric field. The electric field sufficient to produce the breakdown voltage of a ceramic plate is the upper limit of the poling of the ceramic plate.

Further, from measurements using as the reference capacitor 10 a temperature compensation capacitor the temperature coefficient of which can be varied in a range from 0 to −2000 ppm/° C, it has been found that the temperature coefficient of the center frequency $f_o$ of frequency discrimination is varied by only up to 10 percent with the variation of the temperature coefficient of the reference capacitor within the range of 0 to −2000 ppm/° C. This is one of the reasons why fine frequency adjustment in the circuit assembly is not required according to an apparatus of this invention, and integrated circuit technique can be effectively applied thereto.

The piezoelectric "lead titanate ceramic" plate used for the piezoelectric ceramic resonator in the apparatus of this invention is a ceramic plate which uses lead titanate as a major constituent and which does not get broken down by being poled with a poling field of 50 kV/cm. Any known lead titanate ceramic plates which satisfy the definition given above can be used therefor. For example, a ceramic plate the composition of which comprises $PbTiO_3$ as a major component, and $La_{2/3}O_3$ and $MnO_2$ as additive components such as 95.0 mol percent $PbTiO_3$, 4.0 mol percent $La_{2/3}O_3$, 1.0 mol percent $MnO_2$, or 96.5 mol percent $PbTiO_3$, 2.5 mol percent $La_{2/3}O_3$, 1.0 mol percent $MnO_2$, or the like, can be used therefor.

From the above description and the drawings of the embodiments chosen as examples of the principal aspects of this invention, it will be clear to those skilled in the art that certain minor modifications and variations may be employed without departing from the essence and true spirit of this invention. Accordingly, it is to be understood that this invention should be deemed limited only by the fair scope of claims that follow and equivalents thereto.

What is claimed is:

1. A frequency discriminating apparatus for discriminating a frequency in comparison with a predetermined frequency as a center frequency of frequency discrimination, comprising: a pre-amplifier for receiving an input signal to said apparatus and including a tuning circuit for tuning said input signal; a reference capacitor coupled to said pre-amplifier for receiving at the input terminal thereof an output signal from said pre-amplifier; a piezoelectric resonator having a piezoelectric lead titanate ceramic plate with an input electrode and an output electrode on entire opposed major surfaces thereof, respectively, said input electrode being coupled to said pre-amplifier for receiving said output signal from said pre-amplifier, said ceramic plate being poled with a poling field of not less than 50 kV/cm in the thickness direction of said ceramic plate and having a thickness for causing it to vibrate in the thickness-extensional vibration made at the 3rd harmonic overtone of said ceramic plate upon being excited by said output signal from said pre-amplifier for setting the center frequency of frequency discrimination between the resonant frequency and the anti-resonant frequency of said 3rd harmonic overtone of said ceramic plate; a first amplitude detector coupled to said output electrode of said piezoelectric resonator for detecting the amplitude of the output signal from said output electrode of said piezoelectric resonator; and second amplitude detector coupled to the output terminal of said reference capacitor for detecting the amplitude of the output signal from the output terminal of said reference capacitor; and a differential amplitude limiter coupled to said first amplitude detector and said second amplitude detector for differentially adding output signals from said first and said second amplitude detectors and for limiting the added output signals from said first and said second amplitude detectors to predetermined amplitudes in two frequency ranges, one of which includes said resonant frequency and the other of which includes said anti-resonant frequency of said 3rd harmonic overtone of said ceramic plate.

2. A frequency discriminating apparatus according to claim 1, wherein each of said first and said second amplitude detectors includes a rectifier, the rectifying direction of said first amplitude detector being opposite to the rectifying direction of said second amplitude detector.

3. A frequency discriminating apparatus according to claim 1, wherein said pre-amplifier, said first and said second amplitude detectors and said differential amplitude limiter are assembled in the form of an integrated circuit.

4. A frequency discriminating apparatus according to claim 1, wherein said tuning circuit is a broad tuning circuit for balancing an odd symmetry of an output curve of frequency discrimination.

5. A frequency discriminating apparatus according to claim 1, wherein said ceramic plate is in the form of a square plate.

6. A frequency discriminating apparatus according to claim 1, wherein said ceramic plate comprises $PbTiO_3$ as a major component and $La_{2/3}O_3$ and $MnO_2$ as additive components.

* * * * *